United States Patent
Parsons et al.

(10) Patent No.: US 6,429,428 B1
(45) Date of Patent: Aug. 6, 2002

(54) RADIATION DETECTORS

(75) Inventors: Andrew Duncan Parsons; Nicholas Martin Shorrocks; Joanne Hurley, all of Northampton; Matthew Dale Holme, Towcester, all of (GB)

(73) Assignee: Bae Systems Electronics Limited, Farnborough (GB)

( * ) Notice: Subject to any disclaimer, the term of this patent is extended or adjusted under 35 U.S.C. 154(b) by 0 days.

(21) Appl. No.: 09/260,039

(22) Filed: Mar. 2, 1999

(30) Foreign Application Priority Data

Mar. 4, 1998 (GB) .............................................. 9804589

(51) Int. Cl.[7] .............................................. H01L 37/00
(52) U.S. Cl. ................. 250/338.2; 250/332; 250/338.1; 250/338.3; 250/338.4
(58) Field of Search .............................. 250/332, 338.1, 250/338.2, 338.3, 338.4

(56) References Cited

U.S. PATENT DOCUMENTS 6,031,231 A * 2/2000 Kimata et al. .............. 250/332
6,034,369 A * 3/2000 Oda ........................ 250/338.1

FOREIGN PATENT DOCUMENTS

| GB | 2100058 A | 12/1982 |
| GB | 2200245 A | 7/1988 |
| GB | 2200246 A | 7/1988 |

* cited by examiner

*Primary Examiner*—Constantine Hannaher
(74) *Attorney, Agent, or Firm*—Nixon & Vanderhye P.C.

(57) ABSTRACT

A thermal imaging device comprises an array of microbridges(10) disposed on a silicon readout circuit substrate (12). Each microbridge (10) is supported above the substrate (12) by electrodes (14 and 16) so that a cavity (26) is present between the microbridge (10) and the substrate (12). Each microbridge (10) has a collecting area, a region of which is occupied by a ferroelectric active element (20) which converts to received thermal radiation into an electrical response. Radiation which is received by regions of the collecting area not occupied by the active element (20) is converted into heat energy and then transmitted to the active element (20) by conduction.

15 Claims, 1 Drawing Sheet

RADIATION DETECTORS

BACKGROUND OF THE INVENTION

1. Field of the Invention

This invention relates to a radiation detector. It is particularly, but not exclusively, related to a microbridge for a thermal radiation detector.

2. Discussion of Prior Art

Thermal radiation detectors are commonly used to detect infra-red (IR) radiation. Although this can be defined as being in the wavelength range 0.7 μm to 1 mm, the range 8 to 14 μm is of particular interest. This corresponds to a peak in black body radiation emitted by a body at 300 K. It also corresponds to a window in transmissivity of the atmosphere, that is a relatively transmissive wavelength range between regions of the electromagnetic spectrum in which there is significant attenuation of radiation by the atmosphere.

A known thermal detector comprises an array of microbridges mounted on a substrate. Each microbridge has an active element in planar form sandwiched between upper and lower electrodes, both of which are also in planar form. A cavity is defined between the substrate and the lower electrode so as to provide thermal isolation between the active element and the substrate. The active elements comprise a ferroelectric material such as PZT. The use of the pyroelectric effect in thermal detectors is well established. In one embodiment a known thermal detector has a two-dimensional array of microbridges coupled to a readout circuit to give a staring imaging device. Such a thermal detector is described in GB 9625722.5.

It is necessary for a microbridge to have a high degree of thermal isolation from its substrate. This can be achieved by the microbridge being connected to the substrate only by very thin links. Separation of the bulk of a microbridge from the substrate is achieved by fabricating the microbridge over an etchable sacrificial layer and etching it away after the microbridge has been formed.

Generally, the substrate comprises a silicon readout circuit. The electrodes of each microbridge are connected to separate contact points on the readout circuit.

Thermal radiation, such as intra-red radiation, incident on and absorbed by each microbridge produces an electrical response in each active element in which the amount of charge induced across an active element depends on temperature changes. The capacitance across the active element remains substantially constant and so the voltage across the active element also depends on its temperature. Therefore measurement of the voltage across a microbridge provides an indication of its temperature changes which provides an indication of changes in the intensity of thermal radiation falling on it.

For optimum performance, the thermal properties of a microbridge are designed to match its operating frequency, or the centre of the range of operating frequencies. This is achieved by tailoring the thermal time constant of the microbridge, that is the ratio of the heat capacity to the thermal conductance, to be similar to the period of the operating frequency. This provides low thermal losses. The performance can be further improved by reducing both the thermal capacity and the conductance, because this results in an increased temperature change for a given change in the level of absorbed radiation. One method of reducing the heat capacity is to reduce the volume of the active element. A reduced heat capacity is only beneficial if: the amount of radiation absorbed is not significantly reduced; the thermal conductance is reduced so as to keep the thermal time constant approximately constant; and the heat capacity of the active element is similar to or larger than the heat capacity of the rest of the microbridge structure. It is also desirable that the dimensions of the active element are selected such that its electrical impedance is matched to the input impedance of the silicon readout circuit.

If the active element is made thinner, absorption of radiation by it becomes inefficient when its thickness, divided by its refractive index, is significantly thinner, than a quarter of the wavelength of incident radiation. This defines a thickness beyond which it is disadvantageous to make the active element thinner. Furthermore there is a greater likelihood of electrical breakdown of the active element when a high electrical field is applied either for poling or for operation under bias.

SUMMARY OF THE INVENTION

According to the invention there is provided a radiation detector comprising a substrate a microbridge supported above the substrate by electrodes so that a cavity is present between the microbridge and the substrate the microbridge having a collecting area a region of which is occupied by an active area, said active area comprising detector means for converting received radiation into an electrical response characterised in that radiation absorbed by at least one region of the collecting area which is not occupied by the active area is converted into heat energy and transmitted to the active area by conduction.

Preferably the detector comprises a plurality of microbridges. Conveniently they are disposed in an array on the substrate.

Preferably the substrate is a semiconductor substrate. Most preferably it is a silicon readout chip. The chip may comprise, or be connected to, processing means which processes the electrical response of a microbridge to determine radiation intensity incident on the microbridge. Conveniently the electrical response is a charge, a voltage or both. The electrical response may change in response to radiation intensity incident on the microbridge.

Preferably the processing means uses information derived from radiation incident on the array of microbridges to produce an image.

Preferably the active area has a thickness which is a quarter of the wavelength of radiation to be detected.

Preferably the substrate is provided with a reflective surface which reflects incident radiation which passes through the microbridge. Most preferably the reflective surface is planar. Preferably there is a constant separation between the collecting area and the substrate. Advantageously the separation is constant across the whole of the collecting area.

Preferably the detector detects thermal radiation. It may be a thermal imaging device. Preferably it detects radiation in the IR part of the electromagnetic spectrum. Most preferably it detects radiation in the ranges 3 to 5 μm and 8 to 14 μm. Alternatively the microbridge is a detector element which detects electromagnetic radiation in parts of the spectrum other than IR, such as visible and ultra-violet (UV) radiation.

Preferably the radiation detector detects radiation by using the pyroelectric effect.

Preferably the active area comprises a ferroelectric material. The ferroelectric material may comprise lead zirconium tantalate (PZT), lead lanthanum titanate (PLT) or lead scandium tantalate (PST). Conveniently the layer of active material may be formed by deposition from solution and/or a sol-gel technique.

Preferably substantially the majority of heat energy received by the active area is provided by conduction.

BRIEF DESCRIPTION OF THE DRAWINGS

An embodiment of the invention will now be described, by way of example only, with reference to the accompanying drawings in which.

DETAILED DISCUSSION OF PREFERRED EMBODIMENTS

Figure 1:
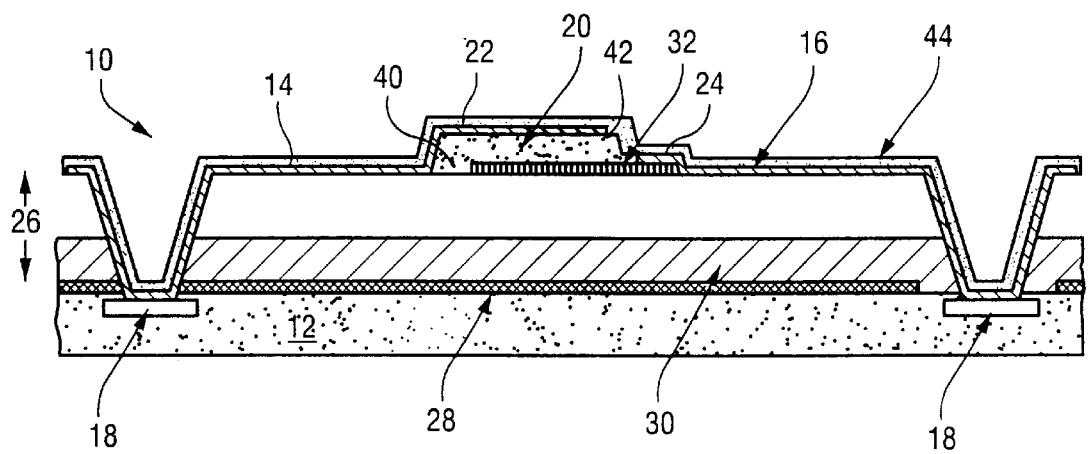
FIG. 1 shows a cross-sectional view of a microbridge.

FIG. 1 shows a cross-sectional view of a microbridge 10 mounted on a silicon readout circuit 12. A detector comprises an array of microbridges. The detector is designed to detect radiation having a wavelength in the range 8 to 14 µm.

In the array, the microbridges have a pitch between 40 µm and 70 µm. Although a pitch of 50 µm is preferred, a pitch as low as 30 µm may be used. The array is hermetically sealed in a near vacuum of sufficiently low pressure so that gas conduction or convection does not affect the operation of the detector. The device has an imaging field rate of between 25 Hz and 180 Hz. A rate of 100 Hz is preferred since this corresponds to a common scanning rate of cathode ray tube monitors. Each microbridge is referred to as a detecting element or a pixel.

The microbridge 10 comprises a pair of electrodes 14 and 16 each of which is connected to an aluminium contact pad 18 on the readout circuit 12. The electrodes are thin films of titanium deposited by physical vapour deposition, for example sputtering. Titanium is chosen because it can be fabricated as an efficient energy absorber in the form of a thin film having a low heat capacity. The thickness of the titanium provides a sheer resistivity in the range 250 to 400Ω/square and ideally 377Ω/square. A suitable thickness to achieve this sheet resistivity is about 10 mm. In other words, the electrodes are lossy. Titanium is also chosen because it is etch resistant and therefore is a relatively stable material in fabrication and processing of the microbridge.

An active element 20 of PZT ferroelectric is sandwiched between a region 22 of electrode 14 (referred to as the upper electrode 22) and a region 24 of electrode 16 (referred to as the lower electrode 24). In the embodiment of the invention shown the electrical response is generated only by the active element 20. The electrodes do not contribute an electrical response.

A cavity 26 is provided between the microbridge 10 and the readout circuit 12. The cavity 26 has a height which is about a quarter of the wavelength of the radiation which the detector is to detect. Since the readout circuit 12 is provided with a reflective coating 28 any radiation which passes through the microbridge 10 travels across the cavity 26 is reflected back to the microbridge 10 and destructively interferes with radiation incident on the microbridge 10. This provides the microbridge 10 with characteristics of high absorption and low reflectivity over as broad wavelength range. The microbridge 10 is sufficiently thin so as not to contribute a significant reflectivity of incident radiation.

The active element 20 also has a thickness approximately equal to a quarter of the wavelength of radiation to be detected. The lower electrode 24 comprises a reflecting electrode 32 (comprising TiPt) which is connected to the electrode 16. The reflecting electrode 32 acts as a reflector of radiation which passes through the active element 20 and thus destructive interference is also caused in the active element. Therefore it enhances absorption of radiation by the microbridge 10. In this embodiment, this may provide only a small enhancement. Therefore it may be preferred to use a thinner active element having a lower intra-red absorption and thus a lower heat capacity.

It should be noted that, in this description, dimensions which are described as being related to the wavelength are a normal wavelength at the centre of the wavelength range to be detected. Dimensions, such as thicknesses, of material are referred to in optical terms. For example, thickness is optical thickness which is the physical thickness multiplied by the refractive index at a particular wavelength.

In the embodiment shown a transparent oxide layer 30 is provided in the cavity 26. Since the microbridge is in a vacuum, the unoccupied part of the cavity 26 has a refractive index of unity. The refractive index of the oxide layer 30 is greater than unity and so physical separation of the microbridge 10 and the readout circuit 12 can be reduced by including the oxide layer 30, and yet still provide a round tip optical path of half of a wavelength for radiation which is incident on the microbridge and then reflected by the reflective coating 28. In this embodiment the oxide layer 30 is a material having a relatively low refractive index and low IR absorption, such as silicon dioxide. Conventionally this is deposited by CVD.

Figure 2:
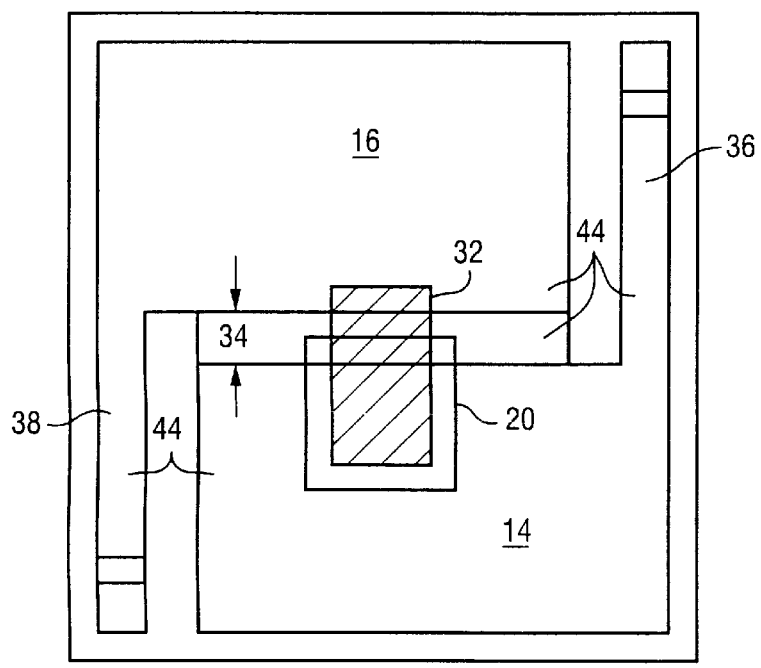
FIG. 2 shows a plan view of a microbridge.

A plan view of the microbridge 10 is shown in FIG. 2 showing the electrodes 14 and 16, the active element 20 and the reflecting electrode 32. Although they are shown in an overlapping arrangement, the true arrangement is clear from FIG. 1. It should be noted that the electrodes 14 and 16 do not overlap but are separated by a gap 34. The reflecting electrode 32 bridges this gap and is disposed beneath the active element 20. The electrodes 14 and 16 are connected to the readout circuit 12 by leg portions 36 and 38 at the contact pads 18. Supporting the microbridge 10 on the leg portions 36 and 38 enhances the thermal isolation of the active element 20 from the readout circuit 12. Edge margins 40 and 42 are provided to prevent shorting between the electrodes 14 and 16.

Referring to FIGS. 1 and 2, it can be seen that the entirety of the microbridge 10 is coated by a transparent supporting layer 44. This covers the electrodes 14 and 16, an exposed region of the active element 20, the margin 42 and the leg portions 36 and 38.

This layer comprises silicon oxide, silicon nitride or a silicon oxynitride. Alternatively it may be a stack of such layers or other dielectric materials such as polymers. It is optically thin, having a thickness of approximately 0.1 µm. The electrodes 14 and 16 and transparent layer 44 are sufficiently thin so as to be insignificant to the optical path provided by the cavity 26. Transparent layer 44 is present as a mechanical support and has an unwanted heat capacity. Some of this heat capacity may be removed by thinning layer 44 or providing it in a pattern having varying thicknesses across its area such that it is of smaller mass overall and yet its properties of mechanical support are maintained.

The microbridge 10 has a collecting area which is defined as the area of the microbridge which receives radiation and converts it into an electrical response or conducts it to the active element 20 so that it can be converted into an electrical response. As described above, the microbridge has two modes of energy absorption, radiation is absorbed by the quarter wave cavity 26 and the quarter wave thickness of the active element 20. The silicon readout circuit 12 detects the voltage generated across the contact pads 18 as a consequence of the pyroelectric effect. The microbridge 10 directly absorbs about 50% of radiation having a wavelength below the IR range and towards the UV range. Beyond about 14 μm the microbridge directly absorbs little radiation.

The collecting area of each microbridge, that is each pixel of the detector, serves as a radiation absorber for each active element 20. The collecting area covers the majority of the area of the microbridge. It is designed to have an electrical impedance matched to free space (that is it has a sheet resistivity of 377Ω/square) to a maximise absorption and minimise reflection of IR radiation and to have the minimum possible thermal capacity. Its thermal conductance is such that, in the time period of a field (typically about 10 ms), any radiation energy absorbed is diffused throughout the structure. This gives the maximum temperature change in the active element for radiation falling anywhere within the collecting area and thus the highest possible pyroelectric responsivity.

The thermal time constant of the microbridge is matched to the field time employed by the detector in order to maximise the response. This time constant is the product of the thermal capacity of the microbridge and the thermal resistance between the microbridge and its surroundings. The matching of time constant is achieved by adjustment of the mass of the microbridge (which determines thermal capacity) and the geometry of the leg portions of the microbridge (which determines the thermal resistance). The lower the mass of the microbridge, the longer and/or thinner the legs need to be to maintain a given thermal time constant. The time constant is close to the field time (at 100 Hz field rate) of 10 ms.

It is possible to deposit PZT material of the active element 20 before the microbridge 10 and any contact vias are formed. Therefore the PZT can be deposited on a highly planar surface which results in a highly planar active element 20. Each electrode 14 and 16 is deposited, in turn, onto the microbridge 10 and contacts pads 18 simultaneously. Since this can be done after deposition of the ferroelectric layer (which is a high temperature process) the electrodes 14 and 16 are not subject to high processing temperatures after they have been deposited and their connection to the contact pads 18 are therefore more reliable.

What is claimed is:
1. A radiation detector comprising:
   a substrate;
   a microbridge supported above the substrate by electrodes;
   a cavity is provided between the microbridge and the substrate, the microbridge comprising a collecting area, a region of said collecting area is occupied by an active area, said active area comprising detector means for converting received radiation into an electrical response, wherein radiation, absorbed by at least one region of the collecting area which is not occupied by the active area, is converted into heat energy and transmitted to the active area by conduction.
2. A detector according to claim 1 in which the substrate is a semiconductor substrate.
3. A detector according to claim 1 in which the substrate is a readout chip.
4. A detector according to claim 1 which comprises a plurality of microbridges.
5. A detector according to claim 4 in which the microbridges are disposed in an array on the substrate.
6. A detector according to claim 5 in which the array of microbridges is connected to processing means which uses information derived from radiation incident on the array to produce an image.
7. A detector according to claim 1 in which the active area has a thickness which is a quarter of the wavelength of radiation to be detected.
8. A detector according to claim 1 in which the substrate is provided with a reflective surface which reflects incident radiation which passes through the microbridge.
9. A detector according to claim 8 in which the reflective surface is planar.
10. A detector according to claim 1 in which there is a constant separation between the collecting area and the substrate.
11. A detector according to claim 1 and adapted to detect thermal radiation.
12. A detector according to claim 1 and adapted to detect radiation in the IR part of the electromagnetic spectrum.
13. A detector according to claim 1 in which said detector means detects radiation by using the pyroelectric effect.
14. A detector according to claim 1 in which the detector means comprises a ferroelectric material.
15. A detector according to claim 1 in which substantially the majority of heat energy received by the active area is provided by conduction.

* * * * *

UNITED STATES PATENT AND TRADEMARK OFFICE
CERTIFICATE OF CORRECTION

PATENT NO. : 6,429,428 B1
DATED : August 6, 2002
INVENTOR(S) : Parsons et al.

It is certified that error appears in the above-identified patent and that said Letters Patent is hereby corrected as shown below:

Column 1,
Line 44, "intra-red" should read -- infra-red --.

Column 3,
Line 1, "tantalate" should read -- titanate --.
Line 40, "sheer" should read -- sheet --.
Line 42, "10 mm" should read -- 10 nm --.

Column 4,
Line 25, "tip" should read -- trip --.

Signed and Sealed this

Eleventh Day of February, 2003

JAMES E. ROGAN
*Director of the United States Patent and Trademark Office*